(12) United States Patent
Kong et al.

(10) Patent No.: US 11,706,869 B2
(45) Date of Patent: Jul. 18, 2023

(54) CROSSTALK SUPPRESSION MICROSTRIP LINE

(71) Applicant: Dell Products L.P., Round Rock, TX (US)

(72) Inventors: Lynn Kong, Shanghai (CN); Jason Pritchard, Hopkinton, MA (US); Raymond Pavlak, Jr., Shrewsbury, MA (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/387,406

(22) Filed: Jul. 28, 2021

(65) Prior Publication Data

US 2023/0032655 A1 Feb. 2, 2023

(51) Int. Cl.
*H05K 1/02* (2006.01)
*H05K 3/10* (2006.01)
*H01P 3/08* (2006.01)

(52) U.S. Cl.
CPC .......... *H05K 1/0218* (2013.01); *H01P 3/081* (2013.01); *H05K 1/0219* (2013.01); *H05K 1/0245* (2013.01); *H05K 3/10* (2013.01); *H05K 2201/09036* (2013.01)

(58) Field of Classification Search
CPC ... H05K 1/0219; H05K 1/0221; H05K 1/0218
See application file for complete search history.

(56) References Cited

U.S. PATENT DOCUMENTS

| | | | |
|---|---|---|---|
| 5,828,555 A * | 10/1998 | Itoh | H05K 1/0221 439/74 |
| 2003/0188889 A1* | 10/2003 | Straub | H05K 1/0219 174/262 |
| 2018/0132344 A1 | 5/2018 | Liao et al. | |
| 2019/0239339 A1 | 8/2019 | Chandra et al. | |

* cited by examiner

*Primary Examiner* — Jeremy C Norris
(74) *Attorney, Agent, or Firm* — Larson Newman, LLP

(57) ABSTRACT

A printed circuit board of an information handling system includes a dielectric layer, adjacent differential pairs, a ground layer, and a ground wall. The adjacent differential pairs are plated on the dielectric layer, and generate crosstalk between each other. The ground wall is in physical communication with and electrically coupled to the ground layer. The ground wall extends substantially perpendicular from the ground layer through the dielectric layer. A top surface of the ground wall is a specific height above a top surface of the adjacent different pairs. The ground wall suppresses the generated crosstalk based on the specific height and a width of the ground wall.

20 Claims, 4 Drawing Sheets

CROSSTALK SUPPRESSION MICROSTRIP LINE

FIELD OF THE DISCLOSURE

The present disclosure generally relates to a crosstalk suppression microstrip line in an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, mobile communication systems, radio frequency/microwave cellular towers, and radar systems. Information handling systems can also implement various virtualized architectures. Data and voice communications among information handling systems may be via networks that are wired, wireless, or some combination.

SUMMARY

A printed circuit board of an information handling system includes a dielectric layer, adjacent differential pairs, a ground layer, and a ground wall. The adjacent differential pairs may be plated on the dielectric layer, and generate crosstalk between each other. The ground wall may be in physical communication with and electrically coupled to the ground layer. The ground wall may extend substantially perpendicularly from the ground layer through the dielectric layer. A top surface of the ground wall may be a specific height above a top surface of the adjacent differential pairs. The ground wall may suppress the generated crosstalk based on the specific height and a width of the ground wall as compared to a substantially similar adjacent differential pair having a similar spacing without the ground wall.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
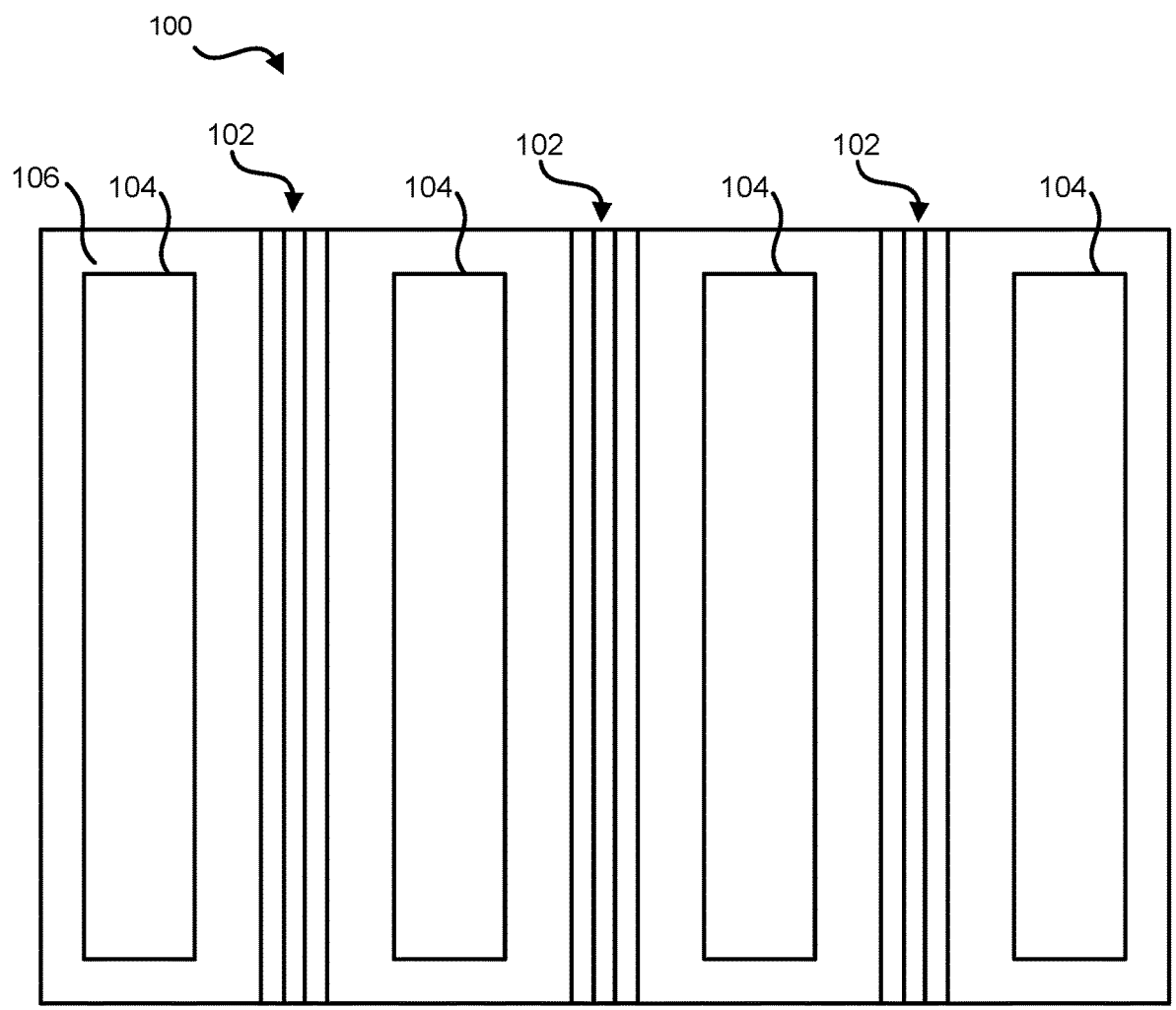
FIG. 1 is a diagram of a printed circuit board with multiple differential microstrip pairs and multiple ground walls according to an embodiment of the present disclosure.

FIG. 1 illustrates a printed circuit board (PCB) 100 with multiple differential microstrip pairs 102 and multiple ground walls 104 according to an embodiment of the present disclosure. Differential microstrip pairs 102 may be plated on a dielectric layer 106 of PCB 100. One of ordinary skill in the art would recognize that any suitable number of differential pairs 102 and ground walls 104 may be plated on PCB 100 without varying from the scope of this disclosure. While ground walls 104 are illustrated to end before the ends of differential pairs 102, one of ordinary skill would recognize that the ground wall may extend any suitable length, such as the entire length of the differential pairs, without varying from the scope of this disclosure.

PCB 100 represents circuit boards that provide a desired function for data processing, such as an information handling system. PCB 100 provides circuit traces, and component pads and through-hole mounting locations for the components that provide the functions and features of the information handling system. As such, PCB 100 will be understood to be fabricated as a multi-layer PCBs with various circuit traces formed on the front and back surfaces of the PCB, with various signal layers, power layers, and ground layers, and the like. The various circuit traces and layers may be formed of gold, nickel, tin, tin-lead, or other materials, as needed or desired. The circuit trace layers, ground layers, and power layers are sandwiched between insulating layers of PCB material which may include prepregnated fiberglass, Duroid, FR4, epoxy resin, or the like, as needed or desired. The circuit trace layers, ground layers, and power layers may include copper layers, aluminum layers, iron layers, or the like, as needed or desired. In an assembly process of the information handling system, various components are placed onto PCB 100 in through-hole mounting locations, surface mounting locations, and the like, and in a solder reflow process, the connections of the components are electrically connected to the PCB. The details of PCB design and manufacturing, and electronic device assembly onto a PCB are known in the art, and will not be further described herein, except as needed to illustrate the current embodiments.

Among the various components that are assembled onto a PCB may include components that provide a high-speed data communication interface that is routed by the PCB between the components, or to connectors assembled onto the PCB to provide the high-speed data communication interface to other components, such as add-in cards, network connections, date connections, or other interfaces to components external to the PCB. Such high-speed data communication interfaces may be single-ended data communication interfaces, where data is transmitted over a single trace and data is communicated with reference to a reference voltage, typically a ground voltage level, or the high-speed data communication interface may be double-ended data communication interfaces, where data is transmitted over a pair of signal traces and data is communicated as a differential signal between the pair of traces. As the speed of high-speed data communication interfaces increases, and the typical distance between the traces decreases, the susceptibility of the high-speed data communication interfaces to cross-talk from other nearby signal sources also increases.

In an example, PCB 100 may be utilized to communicate signals implementing peripheral component interconnect express (PCIe) Generation 6 protocols at high speeds. In certain examples, crosstalk, such as far end crosstalk (FEXT), and limits in link performance increase in microstrip lines 102. Microstrip pair lines 102 may be utilized in any suitable environment including, but not limited to, a surface-mount technology (SMT) connector breakout, an alternating current (AC) coupling capacitor connection, and a short connection. In an example, a short connection may be any suitable distance or length, such as one inch or two inches, between a connector and a chip or another connector to avoid PCB 100 from having layer transition vias in this short distance. In situations or environments utilizing PCIe Gen 6 speeds in PCB 100, microstrip pairs 102 may experience high EXT even with wide pair spacing, such as spacing that is fifteen times the height of a dielectric between the microstip pairs and a ground layer of the PCB. Ground walls 104 may improve FEXT crosstalk between microstrip pairs 102 of PCB 100.

Figure 2:
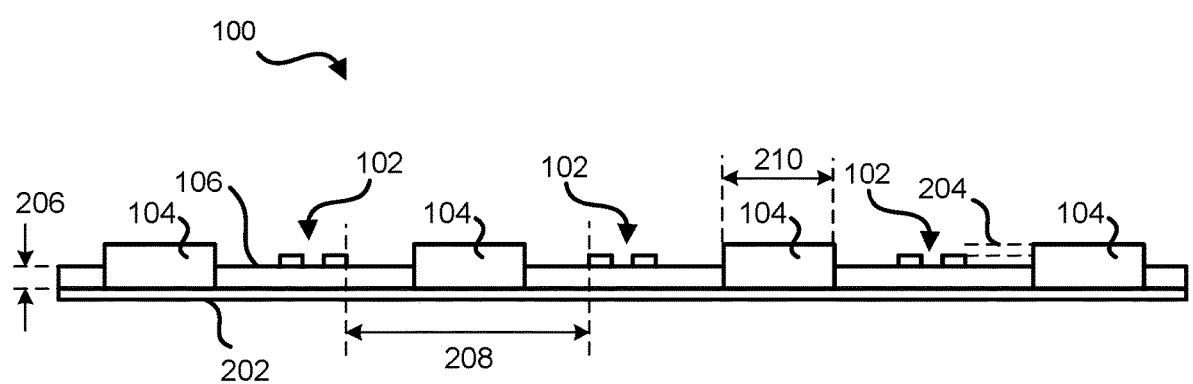
FIG. 2 is a diagram illustrating a side view of the printed circuit board with the differential microstrip pairs and the ground walls according to at least one embodiment of the present disclosure.

FIG. 2 illustrates a side view of PCB 100 including a ground layer 202, differential microstrip pairs 102, and ground walls 104, and a dielectric layer 106 according to at least one embodiment of the present disclosure. Ground walls 104 may extend above differential pairs 102 by a height 204. Dielectric layer 106 may have any suitable height 206, such as a standard height that does not vary from PCB to PCB. Differential pairs 102 may have any suitable spacing 208, and ground walls 104 may have any suitable width 210. In certain examples, dielectric layer 106 may the outer most layer of PCB 100, whether that layer is oriented as a 'top' layer or a 'bottom' layer. One of ordinary skill in the art would recognize that if two PCBs are stacked together, dielectric layer 106 would be the top layer in one of the PCBs and would be the bottom layer in the other PCB.

In an example, ground walls 104 may be physically connected and electrically coupled to ground layer 202 of PCB 110. In certain examples, ground walls 104 may provide FEXT crosstalk suppression without being limited by a frequency of signals transmitted via differential pairs 102. For example, ground walls 104 may not have an upper frequency limit because the ground walls are continuously physically connected and electrically coupled to ground layer 202 of PCB 110. In an example, ground wall 104 being in continuous linear contact with ground layer 202 along the length of differential pairs 102, may result in the ground walls not having a limitation in frequency. However, previous PCNs may have a wall grounded to a ground layer by periodically spaced vias. The periodically grounded wall does have an upper frequency limit based on the spacing between vias. Specifically, when the via spacing is half wavelength or longer, the ground wall regions between the vias are no longer well grounded and wall shielding effectiveness, such as crosstalk suppression, degrades.

In an example, FEXT crosstalk between adjacent differential pairs 102 may be reduced by a combination of height 204 and width 210 associated with ground wall 104 between the adjacent differential pairs. In certain examples, the larger height 204 the greater FEXT crosstalk suppression generated by ground wall 104. In this example, an overall height of ground wall 104 may be limited by manufacturing constraints, such that a maximum amount of FEXT crosstalk suppression may be generated by the ground wall.

In certain examples, spacing 208 between differential pairs 102 may be reduced by any suitable manner while maintaining a similar amount of crosstalk suppression. Without a change in ground walls 104, the smaller spacing 208 may result in a greater amount of FEXT crosstalk. In this situation, spacing 208 may be decreased while maintaining crosstalk suppression by increasing height 204. In an example, routing area on PCB 100 may be saved based on a reduction of spacing 208 of differential pairs 102 available based on an increase of height 204. Thus, ground walls 104 may increase FEXT crosstalk suppression and decrease routing area on PCB 100 based on an increase in the overall height of the ground walls, which in turn increases height 204. In certain examples, height 204, spacing 208, and widths 210 may be adjusted from one PCB to the next based on a tradeoff between crosstalk suppression and routing density needed for a given application of PCB 100.

While PCB 100 has been described herein with respect to a single implementation of an information handling systems, one of ordinary skill in the art would recognize that a similar crosstalk issue may exist in other areas, and the mitigation solution presented here may be applied those areas. For example, PCB 100 may be used in an RF/microwave transceiver placed on cellular telephone towers to communicate with cellular telephones. Such transceivers may have PCBs with analog-to-digital converters (ADCs) and digital-to-analog converters (DACs), which in turn use differential microstrip lines to carry either analog RF signals or digital data signals to and from the integrated circuit (IC) packages containing the ADCs and/or DACs. These differential microstrip lines, whether carrying analog RF or digital data signals, may be subject to the same crosstalk phenomenon described herein. The mitigation solution proposed here also applies equally well whether transporting analog RF or digital data signals and whether the microstrip line is single-ended or differential.

Figure 3:
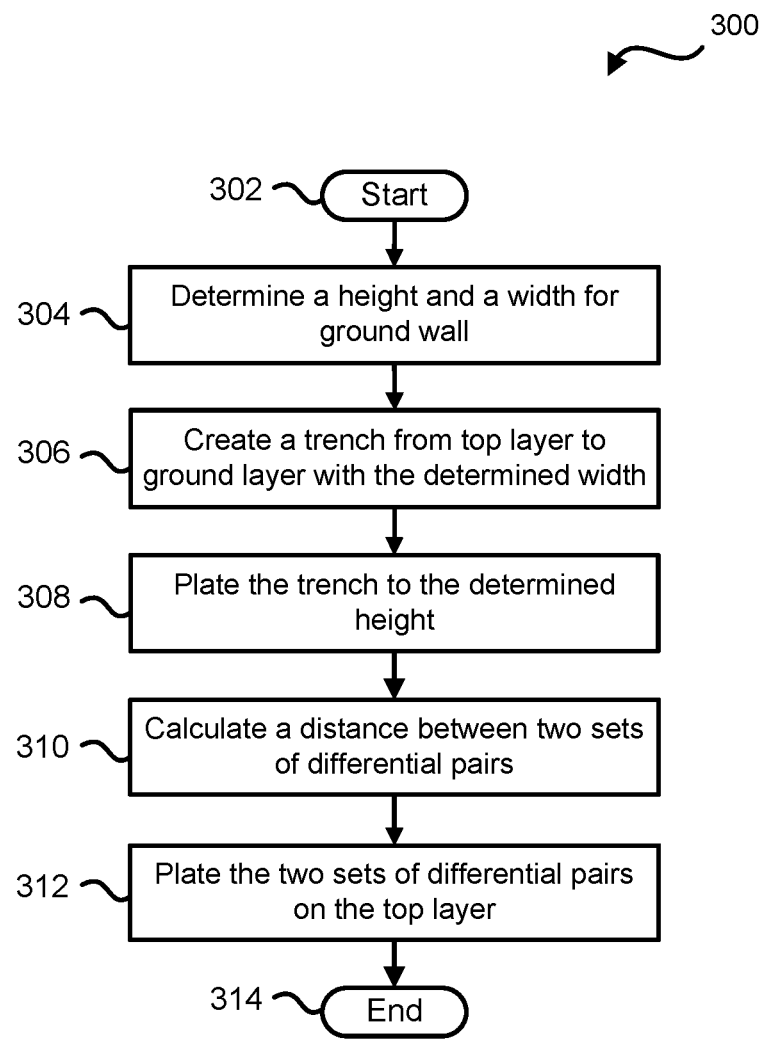
FIG. 3 is a flow diagram for creating a printed circuit board with a ground wall between differential microstrip pairs according to at least one embodiment of the present disclosure.

FIG. 3 is a flow diagram for creating a printed circuit board with a ground wall between differential microstrip pairs according to at least one embodiment of the present disclosure, starting at block 302. It will be readily appreciated that not every method step set forth in this flow diagram is always necessary, and that certain steps of the methods may be combined, performed simultaneously, in a different order, or perhaps omitted, without varying from the scope of the disclosure.

At block 304, a height and a width for a ground wall of a PCB is determined. In an example, the height of the ground wall may be set to any desired height, such as a maximum height allowed by a manufacturers limitations. In certain examples, the width of the ground wall may be determined based on any suitable criteria including, but not limited to, routing space and a minimum amount of crosstalk suppression. In an example, as the height of the ground wall is increased, the width of the ground wall may be reduced and the same amount of crosstalk suppression may be obtained or created by the ground wall.

At block 306, a trench is created in the PCB from the dielectric layer to the ground layer and the trench is made with the determined width. At block 308, the trench is plated to the determined height. In an example, the ground wall may be plated above the dielectric layer by utilizing selective plating. In certain examples, the trench may be plated using any suitable PCB plating process including, but not limited to, utilizing a dry film as a plating resist.

At block 310, a distance between two sets of differential pairs is calculated. In an example, distance may be determined based on any suitable factors including, but not limited to, signal transmission speeds on the differential pairs, and a combination of the height and width of the ground wall. For example, as transmission speeds increase the distance between or spacing of two sets of differential pairs may be increased unless the combination of the height and width of the ground wall is increased. At block 312, the two sets of differential pairs are plated on the dielectric layer, and the method ends at block 314. In an example, the two sets of differential pairs are plated with the determined distance or spacing, and the ground wall is located between the two sets of differential pairs.

Figure 4:
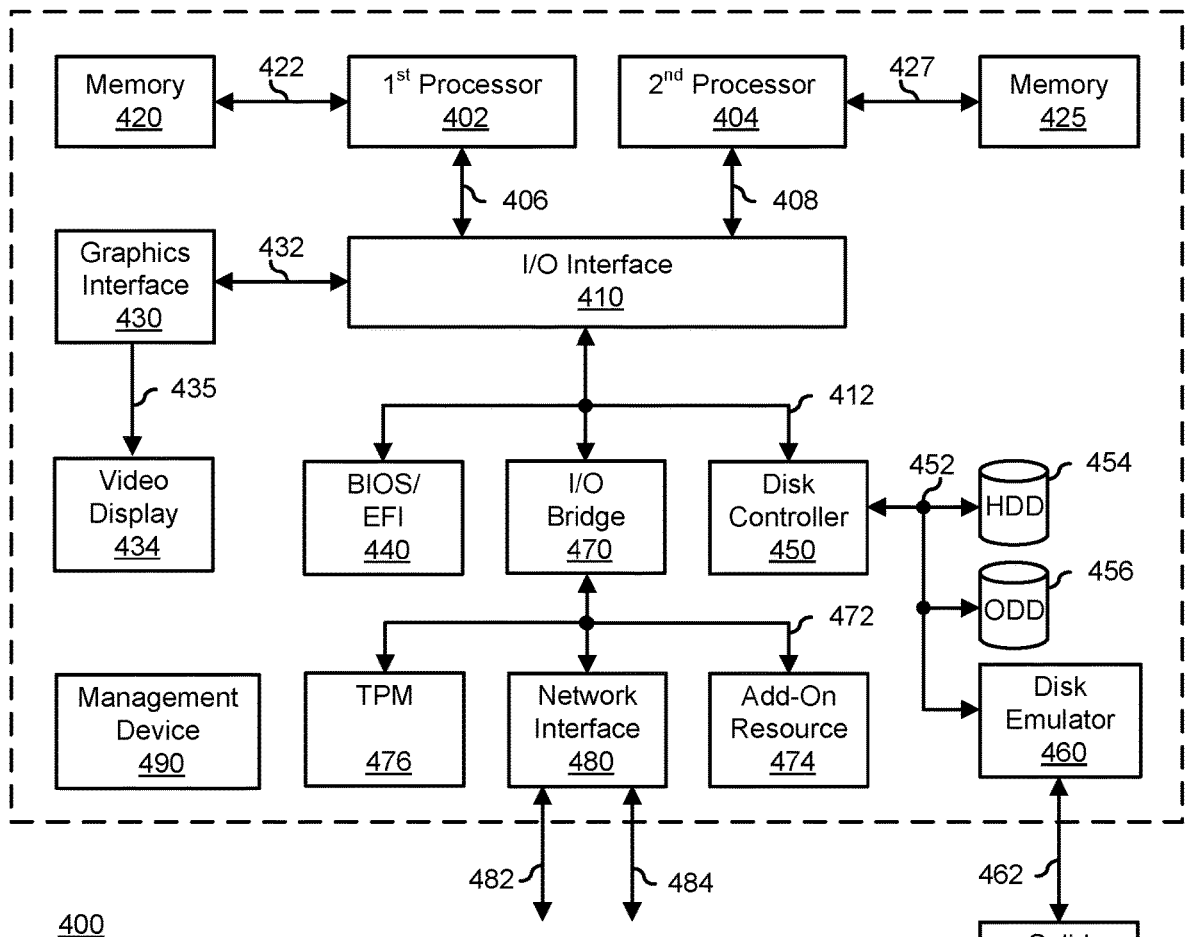
FIG. 4 is a block diagram illustrating a generalized information handling system according to another embodiment of the present disclosure.

FIG. 4 illustrates a generalized embodiment of an information handling system 400. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device, a game, wearable devices or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described below, and operates to perform one or more of the methods described below. Information handling system 400 includes a processors 402 and 404, an input/output (I/O) interface 410, memories 420 and 425, a graphics interface 430, a basic input and output system/universal extensible firmware interface (BIOS/UEFI) module 440, a disk controller 450, a hard disk drive (HDD) 454, an optical disk drive (ODD) 456, a disk emulator 460 connected to an external solid state drive (SSD) 462, an I/O bridge 470, one or more add-on resources 474, a trusted platform module (TPM) 476, a network interface 480, and a management device 490. Processors 402 and 404, I/O interface 410, memory 420, graphics interface 430, BIOS/UEFI module 440, disk controller 450, HDD 454, ODD 456, disk emulator 460, SSD 462, I/O bridge 470, add-on resources 474, TPM 476, and network interface 480 operate together to provide a host environment of information handling system 400 that operates to provide the data processing functionality of the information handling system. The host environment operates to execute machine-executable code, including platform BIOS/UEFI code, device firmware, operating system code, applications, programs, and the like, to perform the data processing tasks associated with information handling system 400.

In the host environment, processor 402 is connected to I/O interface 410 via processor interface 406, and processor 404 is connected to the I/O interface via processor interface 408. Memory 420 is connected to processor 402 via a memory interface 422. Memory 425 is connected to processor 404 via a memory interface 427. Graphics interface 430 is connected to I/O interface 410 via a graphics interface 432, and provides a video display output 435 to a video display 434. In a particular embodiment, information handling system 400 includes separate memories that are dedicated to each of processors 402 and 404 via separate memory interfaces. An example of memories 420 and 425 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 440, disk controller 450, and I/O bridge 470 are connected to I/O interface 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 410 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 440 includes BIOS/UEFI code operable to detect resources within information handling system 400, to provide drivers for the resources, initialize the resources, and access the resources. BIOS/UEFI module 440 includes code that operates to detect resources within information handling system 400, to provide drivers for the resources, to initialize the resources, and to access the resources.

Disk controller 450 includes a disk interface 452 that connects the disk controller to HDD 454, to ODD 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits SSD 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O bridge 470 includes a peripheral interface 472 that connects the I/O bridge to add-on resource 474, to TPM 476, and to network interface 480. Peripheral interface 472 can be the same type of interface as I/O channel 412, or can be a different type of interface. As such, I/O bridge 470 extends the capacity of I/O channel 412 when peripheral interface 472 and the I/O channel are of the same type, and the I/O bridge translates information from a format suitable to the I/O channel to a format suitable to the peripheral channel 472 when they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as I/O interface 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Management device 490 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 400. In particular, management device 490 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 400, such as system cooling fans and power supplies. Management device 490 can include a network connection to an external management system, and the management device can communicate with the management system to report status information for information handling system 400, to receive BIOS/UEFI or system firmware updates, or to perform other task for managing and controlling the operation of information handling system 400. Management device 490 can operate off of a separate power plane from the components of the host environment so that the management device receives power to manage information handling system 400 when the information handling system is otherwise shut down. An example of management device 490 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 490 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A printed circuit board for an information handling system, the printed circuit board comprising:
    a dielectric layer;
    adjacent differential pairs plated on a top surface of the dielectric layer, the adjacent differential pairs generating crosstalk between each other;
    a ground layer below the dielectric layer; and
    a ground wall in continuous physical communication with and electrically coupled to the ground layer, the ground wall extending substantially perpendicularly from the ground layer through the dielectric layer, wherein a top surface of the ground wall is a specific height above a top surface of the adjacent different pairs, the ground wall suppressing the generated crosstalk based on the specific height and a width of the ground wall.

2. The printed circuit board of claim 1, wherein the width is determined based on a combination of the specific height and a desired amount of crosstalk suppression.

3. The printed circuit board of claim 1, wherein the ground wall is located in between the adjacent pairs.

4. The printed circuit board of claim 1, wherein a spacing between the adjacent pairs is determined based on the specific height.

5. The printed circuit board of claim 4, wherein the spacing decreases as the specific height increases.

6. The printed circuit board of claim 1, wherein a suppression of the generated crosstalk increases as the specific height increases.

7. The printed circuit board of claim 1, wherein a suppression of the generated crosstalk increases as the width increases.

8. The printed circuit board of claim 1, wherein the specific height is limited by manufacturing constraints.

9. A printed circuit board for an information handling system, the printed circuit board comprising:
- a dielectric layer;
- adjacent differential pairs plated on a top surface of the dielectric layer, the adjacent differential pairs generating crosstalk between each other;
- a ground layer below the dielectric layer; and
- a ground wall in continuous physical communication with and electrically coupled to the ground layer, wherein the ground wall is located in between the adjacent pairs, the ground wall extending substantially perpendicularly from the ground layer through the dielectric layer, wherein a top surface of the ground wall is a specific height above a top surface of the adjacent different pairs, the ground wall suppressing the generated crosstalk based on the specific height and a width of the ground wall, wherein a spacing between the adjacent pairs decreases as the specific height increases.

10. The printed circuit board of claim 9, wherein the width is determined based on a combination of the specific height and a desired amount of crosstalk suppression.

11. The printed circuit board of claim 9, wherein a suppression of the generated crosstalk increases as the specific height increases.

12. The printed circuit board of claim 9, wherein a suppression of the generated crosstalk increases as the width increases.

13. The printed circuit board of claim 9, wherein the spacing between the adjacent pairs is determined based on the specific height and the width.

14. The printed circuit board of claim 9, wherein the specific height is limited by manufacturing constraints.

15. A method comprising:
- determining a width for a ground wall of a printed circuit board based on a height of the ground wall and an amount of crosstalk suppression;
- creating a trench from a dielectric layer of the printed circuit board to a ground layer of the printed circuit board, wherein the trench is the determined width;
- plating the trench to create the ground wall with the height;
- determining a spacing between adjacent different pairs based on a combination of the height and the width of the ground wall; and
- plating the adjacent differential pairs on a top surface of the dielectric layer of the printed circuit board with the determined spacing between the adjacent differential pairs wherein a top surface of the ground wall is a specific height above a top surface of the adjacent different pairs.

16. The method of claim 15, wherein the determined spacing is reduced in response to an increased in the height of the ground wall.

17. The method of claim 15, wherein the ground wall is located in between the adjacent differential pairs.

18. The method of claim 15, wherein the crosstalk suppression increases as the height increases and the width remains the same.

19. The method of claim 15, wherein the crosstalk suppression remains constant as the height increases and the width decreases.

20. The method of claim 16, wherein the specific height is limited by manufacturing constraints.

\* \* \* \* \*